US005454726A

United States Patent [19]

Lee et al.

[11] Patent Number: 5,454,726

[45] Date of Patent: Oct. 3, 1995

[54] ELECTRICAL CONNECTOR

[75] Inventors: Kow C. Lee, Chungli; Chou L. Chen, Taoyuan; Bo W. Wang, Taipei, all of Taiwan, Prov. of China

[73] Assignee: Berg Technology, Inc., Reno, Nev.

[21] Appl. No.: 381,469

[22] Filed: Jan. 31, 1995

Related U.S. Application Data

[63] Continuation of Ser. No. 36,379, Mar. 24, 1993, abandoned.

[30] Foreign Application Priority Data

Mar. 27, 1992 [JP] Japan .................................... 4-016877

[51] Int. Cl.$^6$ ...................................................... H05K 1/00

[52] U.S. Cl. .............................................. 439/65; 439/310

[58] Field of Search .................................... 439/607, 608, 439/609, 610, 65, 79, 350, 357, 358, 108, 296

[56] References Cited

U.S. PATENT DOCUMENTS

| | | | |
|---|---|---|---|
| 4,480,885 | 11/1984 | Coppelman | 439/65 |
| 4,678,256 | 7/1987 | Nishino et al. | 439/347 |
| 4,681,386 | 7/1987 | Boulanger | 439/347 |
| 5,104,329 | 4/1992 | Brown et al. | 439/609 |
| 5,169,324 | 12/1992 | Lemke et al. | 434/607 |

FOREIGN PATENT DOCUMENTS

| | | |
|---|---|---|
| 0189979 | 6/1986 | European Pat. Off. . |

*Primary Examiner*—Gary F. Paumen
*Assistant Examiner*—Hien D. Vu
*Attorney, Agent, or Firm*—Woodcock, Washburn, Kurtz, Mackiewicz & Norris

[57] ABSTRACT

A pair of plug-side engagement members are mounted one at each end of a plug connector attached to a mother board. A pair of receptacle-side elastic members are provided on a daughter board attached to a receptacle connector, os that the receptacle-side elastic members correspond to the plug-side engagement members. With the plug-side engagement members connected to the receptacle-side members, the former is elastically engaged to the latter so that a mechanical insertion force is exerted on the plug-side and receptacle-side connectors to force the plug and receptacle together.

2 Claims, 3 Drawing Sheets

ELECTRICAL CONNECTOR

This is a continuation of application Ser. No. 08/036,379, filed Mar. 24, 1993, now abandoned.

BACKGROUND OF THE INVENTION

1. Field of the Invention

The present invention relates to an electrical connector for allowing a digital signal transfer between circuit boards in a digital data processing apparatus such as a personal computer or in a digital communications apparatus.

2. Description of the Related Art

In a digital data processing apparatus or a digital communications apparatus, there is a growing demand for a high-sped signal transfer, for a high density terminal array for signal input and output and for the downsizing of an apparatus involved.

With an electrical connector used as a board-to-board interconnect system, a demand has also been made for an increase in the number of contacts involved, for a high pitch array of contacts involved and for a decrease int he size of the connector. In order to satisfy these demands, there is a risk that a mechanical connection force will be somewhat sacrificed, and also there is a difficult situation in which electrical connection needs to be ensured between the two boards.

In the connector with a high density array of contacts, for example, the length of the contacts is so designed as to be made shorter for the purpose of suppressing any crosstalk among those contacts in a high-density array. The shortening of the length of the contacts decreases a mechanical connection force acting between the plug connector and the receptacle connector. This makes it difficult to secure a positive electrical connection between the two circuit boards.

SUMMARY OF THE INVENTION

It is accordingly an object of the present invention to provide an electrical connector which ensures an increase in the number of contacts involved, narrowing of their pitch in a contact array, and positive electrical connection between the circuit boards.

A connector device according to the present invention comprises:

a first nonconductive body having a plurality of first contacts molded therein;

a first metal body supporting the first nonconductive body in an electrically non-contacting relation to the first contacts and attached to a first circuit board;

a pair of elastic members detachably mounted one at each end of the first metal body and having an elastic force acting in a direction of the first contacts;

a second nonconductive body having a plurality of second contacts molded therein;

a second metal body matingly connected to the first metal body to support the second nonconductive body in an electrically non-contacting relation to the second contacts and to connect together the first and second contacts, the second metal body being attached to a second circuit board; and a pair of engagement members detachably mounted one at each end of the second metal body and elastically held between the paired elastic members so that the second metal body can be attached or connected to the first metal body.

At least one of the first and second metal bodies may have a nonconductive member for positioning the contacts.

According to the connector of the present invention, the paired elastic members for the first metal body elastically engage the paired engagement members for the second metal body so that the first and second metal bodies are mechanically connected to each other.

Even in the connector having many contacts in a narrow-pitch array, the size of a whole connector can be minimized with no sacrifice of an insertion force on the contacts. Thus the two circuit boards can be positively connected to each other.

The engagement member and elastic member are detachably mounted relative to the metal body and can readily be detached, depending upon the use to which the connector is put.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENTS

Figure 1:
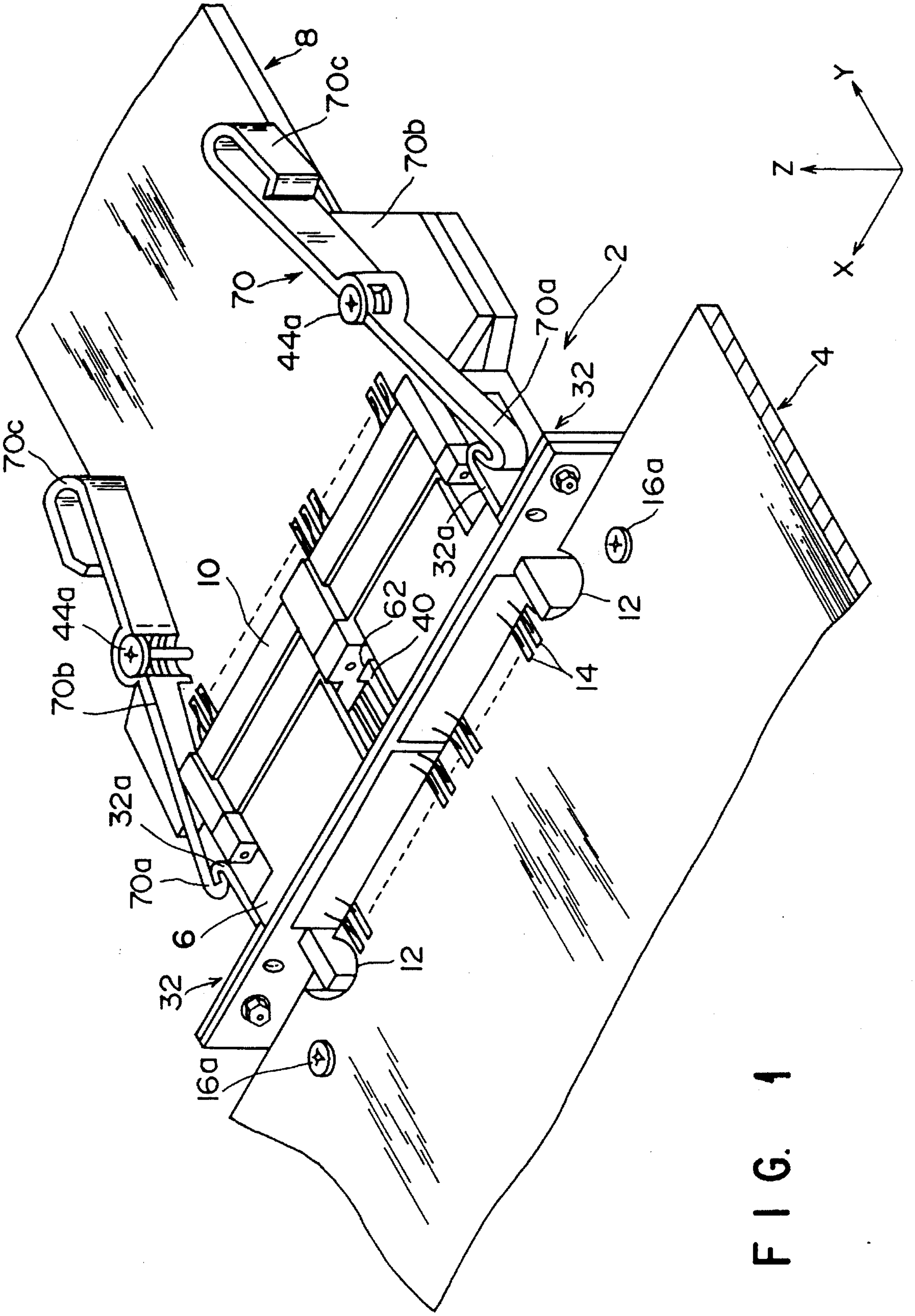
FIG. 1 is a perspective view showing an electrical connector according to an embodiment of the present invention.

In FIG. 1, an electrical connector 2 of the present invention is comprised of a two-piece type connector having a plug 6 to be attached to the edges of a mother board 4 and a receptacle 10 to be attached to the edge of a daughter board 8. These two connectors 6 and 10 can be matingly connected to each other. The mother board 4 and daughter board 8 are incorporated into, for example, a notebook computer.

In the Figures, X shows the longinudinal direction of the connectors 6 and 10; Y shows a direction in which the connectors 6 and 10 are matingly connected to each other; and Z shows the thickness direction of these boards.

Figure 2:
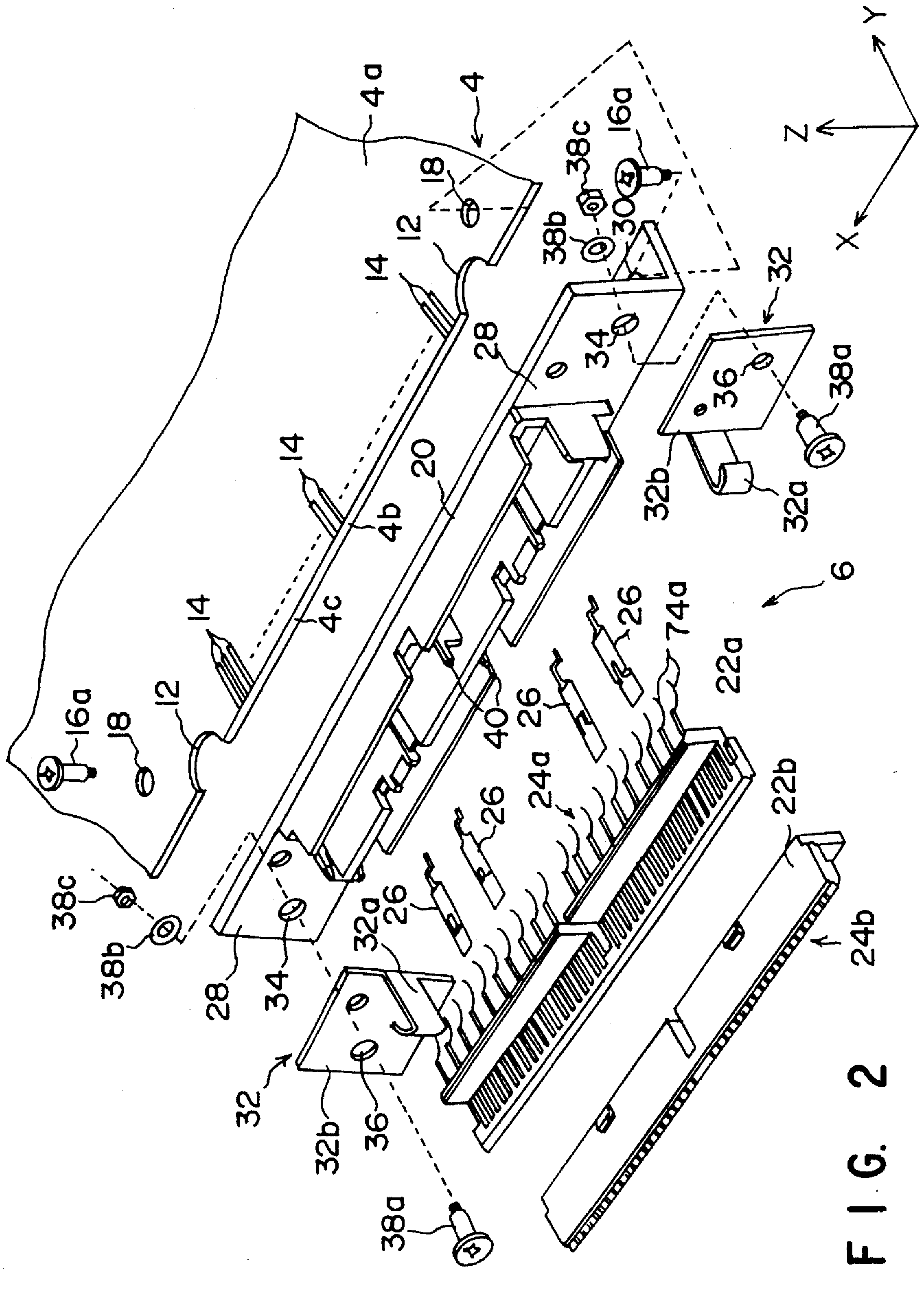
FIG. 2 is an exploded perspective view showing a plug connector in FIG. 1.

Referring to FIG. 2, the end edge 4*c* of the mother board 4 has a pair of cutouts 12 for mating connection of the plug 6. Solder pads 14 extend from the end of edge 4*c* of the mother board 4 at an area between the cutouts 12. Screw holes 18 are provided at these areas of the mother board 4 in the neighborhood of the cutouts 12 so that the plug 6 is secured, by screws 16*a*, in place.

The plug 6 has an outer metal body, that is, a metal frame 20, and upper and lower insulating resin bodies 22*a* and 22*b* inserted into the metal frame 20.

Those plug contact rows 24*a* and 24*b* are arranged as two arrays on the insulating resin bodies 22a and 22b in the X direction of the plug 6 such that they are molded in a blade-like fashion in the insulating resin bodies 22a and 22b, the two arrays of blade-like plug terminals 24a and 24b are arranged in a mutually parallel way at a middle of the Z-direction height of the connector 6. Ground terminals 26 are inserted between the plug terminal 24a and 24b.

Mount lugs 28 are L-shaped in cross-section and extend at each end of the metal frame 20 and each mount lug 28 has a screw hole 30 at one section of the L-shape corresponding to the screw hole 18 in the mother board 4 and a screw hold 34 at the other section corresponding to the screw hole 36 for mounting a plug-side metal engagement member 32.

The plug-side metal engagement members 32 have engagement sections 32a between which a portion of the metal frame 20 is sandwiched in the X direction. The plug-side metal latch members further have mounting sections 32b. The forward end portion of the engagement section 32a is folded back toward the mother board 4 side. The mounting section 32b has a screw hole 36 corresponding to the screw hole 34 of the mount lug 28. The mounting section 32b of the engagement member 32 is secured to the mount lug 28 by inserting a screw 38a through the screw holes 36 and 34 and threadably connecting connecting it to a nut 38c with a washer 38b set therebetween. In this state, the pair of engagement sections 32a can be elastically displaced in the X direction.

A forward end of a screw 16a is inserted into the corresponding screw hole 18 in the mother board 4 and screw hole 30 in the fixed section of the mount lug 28 and is threadably attached to a mother board mount section, not shown, at a predetermined place in a notebook computer. Thus the screw 16a performs a double function of fixing the plug 6 to the mother board 4 and fixedly supporting the mother board 4 in the notebook computer.

A pair of guide pins 40 are projected, in the Y direction, at the middle of the metal from 20.

Figure 3:
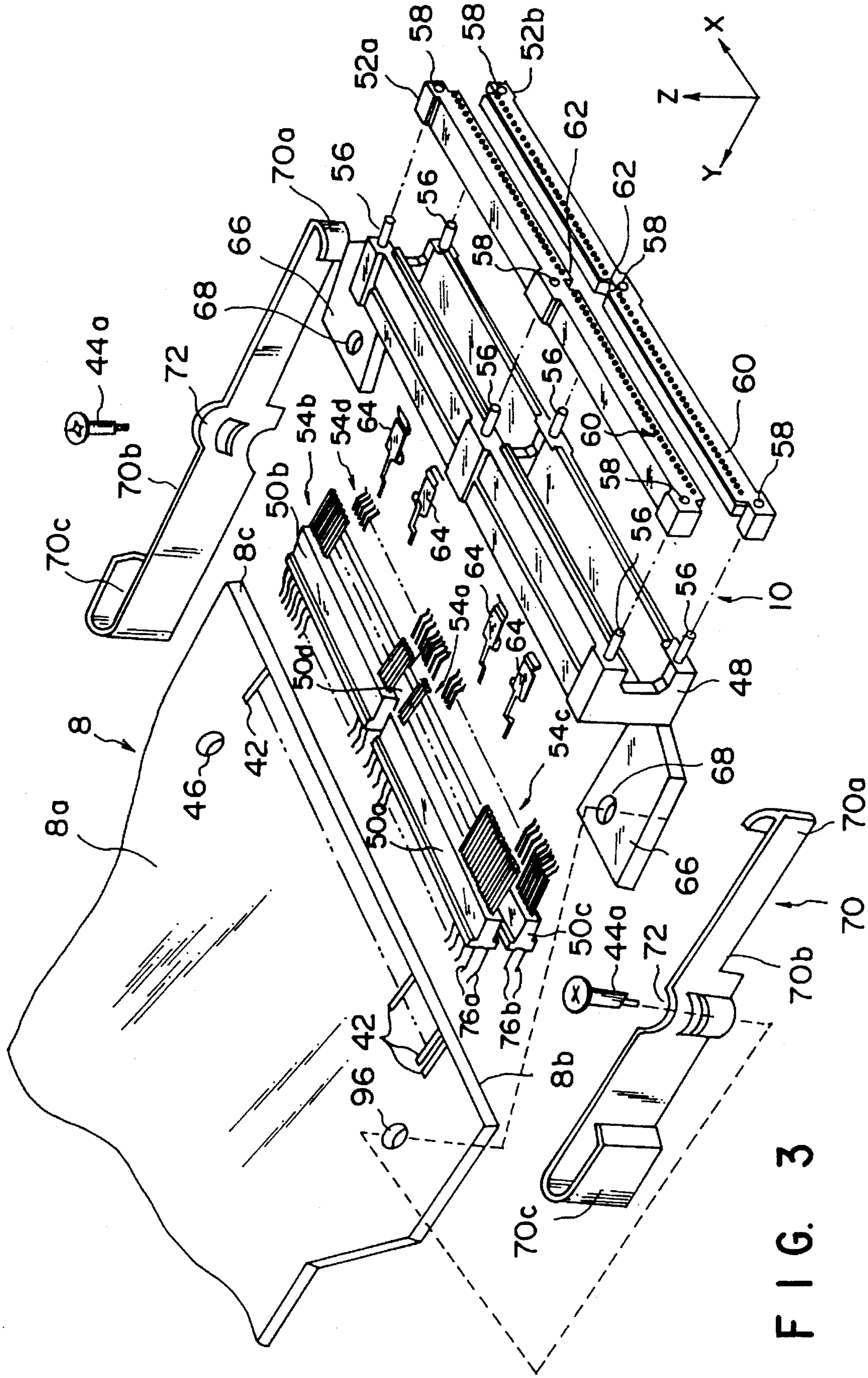
FIG. 3 is an exploded perspective view showing a receptacle connector in FIG. 1.

Referring to FIG. 3, solder pads 42 are provided at an end edge portion 8c of the daughter board 8. A screw hole 46 for fixing the receptacle 10 in place by a screw 44a is provided at each side portion of an array of the solder pads 42.

The receptacle 10 has an outside metal body, that is, a metal frame 48 and 2 rows×2 columns inside insulating resin bodies (50a, 50b, 50c, 50d) inserted into the metal frame 48. The receptacle connector 10 preferably further includes 2 rows of outer insulating resin bodies 52a and 52b matingly connected to the outer section of the metal frame 48.

Receptacle contact rows 54a, 54b, 54c and 54d are molded in the inside bodies 50a to 50d such that they are arranged along the X direction of the receptacle 10. The receptacle terminal rows 54a, . . . , 54d are arranged in 2 rows×2 columns in a manner to correspond to the inside bodies 50a, . . . , 50d with the terminal rows 54a and 54b set as an upper array and the terminal rows 54c and 54d set as a lower array.

Projections 56 are provided at the outer wall of the metal frame 48 so that they are fitted into the outer insulating resin bodies 52a and 52b.

Holes 58 are provided between both the ends of outer insulating resin bodies 52a and 52b so that the projections 56 of the metal frame 48 are fitted into the holes 58. Holes 60 are arranged along the X direction of the bodies 52a and 52b and allow the forward ends of the receptacle terminals in the respective rows 54a, . . . , 54d to be inserted therethrough and these terminal rows 54a, . . . , 54d to be located there. Guide holes 62 are further provided at the middle of the bodies 52a and 52b to allow the guide pin 40 of the plug 6 to engage therewith. A portion of the metal frame 20 of the plug 6 can be inserted onto the outer bodies 52a and 52b.

The upper terminal rows 54a and 54b and lower terminal rows 54c and 54d are positioned by the top bodies 52a and 52b in a manner to face each other in a spaced-apart relation. Ground terminals 64 are inserted between the upper receptacle terminal rows 54a, 54b and the lower receptacle terminal rows 54c, 54d. The bladelike plug terminal rows (22a, 22b) can be matingly connected between the upper receptacle terminal row and the lower receptacle terminal row.

Plate-like mount lugs 66 extend at the lower surfaces of both the end portions of the metal frame 48 and each have a screw hole 68 corresponding to the screw hole 46 of the daughter board 8.

A pair of receptacle-side metal elastic members 70 each have an engagement section 70a on one end, that is, on the mother board 4 side, a force receiving portion such as a handle section 70c on the other end, that is, on the daughter board side, and a leaf spring section 70b between the engagement section 70a and the handle section 70c, all these sections being formed as an integral unit. A screw hole 72 is provided as a curved section at the leaf spring section 70b such that it corresponds to the screw hole 68 of the mount lug 66 and screw hole 46 of the daughter board 8.

The forward end portion of the engagement section 70a is folded back toward the daughter board side. This folded-back section of the engagement section 70a is engaged with a folded-back section of engagement section 32a of a plug-side latch member 32. The forward end portion of the handle section 70c is folded back toward the mother board 4 side and has such a configuration as to be readier to handle by hand.

The respective metal elastic member 70 is formed, by a striking/bending method, from one elastic metal sheet.

The screw 44a is sequentially inserted through the screw holes 72, 46 and 68 so that its forward end is threadably mounted on the daughter board's mount area (not shown) at a proper place in the notebook computer. By so doing, the metal frame 48 of the receptacle connector 10 is fixed to the daughter board 8 so that the elastic member 70 can be supported on the daughter board 8 as shown in FIG. 1. When the metal frame 48 of the receptacle 10 and daughter board 8 are brought sufficiently close to the metal frame 20 of the plug 6 so that the receptacle and plug are positioned to mate, the elastic members 70 are placed on the daughter board 8 supported by screws 44a and engagement sections 70a are manually engaged with engagement section 32a while the elastic members 70 are supported on the daughter board 8. In this state, the engagement section 70a is elastically displaceable in the X direction by applying inward force in the x direction on each handle section 70c to journal (pivot) the elastic members 70 about screws 44a. Through the journaling (pivoting) of the elastic members, the force between the engaged engagement sections 32a, 70a is increased in the y direction thereby increasing the insertion force to connect the plug and receptacle.

The resin bodies 22a, 22b and 50a to 50d and 52a, 52b of the connectors 6 and 10 prevent contact from being made between the terminal rows 24a, 24b, 54a to 54d and the metal frames 20, 48 and prevent short-circuiting between their terminals. These resin bodies are made of proper resin, such as polyamide resin and Zytel FR-50 commercially available under the trade name manufactured by E. I. Du Pont de Nemours & Co.

Connecting together the mother board 4 and the daughter board 8 by the connector 2 will be explained below.

Solder tails 74*a* of the upper plug terminal row 22*a* and those (not shown) of the lower plug terminal row 22*b* for the plug 6 are soldered to solder pads 14 of a circuit on one surface 4*a* of the mother board 4 and solder pads (not shown) of a circuit on the other surface 4*b* of the mother board. Similarly, solder tails 76*a*, 76*b* of the receptacle terminals on the receptacle connector 10 are soldered to the corresponding solder pads 42 of both surfaces 8*a*, 8*b* of the circuits of the daughter board 8, only one surface 8*a* of these surfaces being shown for brevity's sake.

The engagement section-to-engagement section force can be made greater by manually pushing the handle sections 70*c* of the paired receptacle-side metal elastic members 70 inward. The plug 6 is thereby matingly connected to the receptacle 10 and hence the plug connection terminal rows are connected to the receptacle connection terminal rows. Upon the release of the manual pressure on the handle section 70*c* of the metal elastic member 70, the forward end portion of the receptacle 10 is positively mechanically connected to the plug 6. Thus the mother board 4 is horizontally connected to the daughter board 8 though the connectors 6 and 10.

If there is no need to increase the insertion force as to connect together the connectors 6 and 10 in view of the state in which the boards 4 and 8 are fixed to each other, the engagement members 32 and elastic members 70 can be detached from the rest of the connector device so that it can be used as a conventional connector.

The present invention is not restricted to the aforementioned embodiment and various changes or modifications of the present invention can be made without departing from the spirit and scope of the present invention.

In the aforementioned embodiment, for example, the plug connector 6 and receptacle 10 may be connected to the daughter board 8 and mother board 4, respectively.

Or the mount lug 66 and metal elastic member 70 may be provided on the plug 6 and the mount lug 28 and metal engagement 32 may be provided on the receptacle 10.

In the aforementioned embodiment, nonconductive members for positioning the connection terminals may be provided not only on the metal frame 48 but also on the metal frame 20 of the plug 6.

We claim:

1. An electrical connector for connecting a first circuit board to a second board, comprising:

a first nonconductive body having a plurality of first contacts molded therein;

a first metal body supporting the first nonconductive body in an electrically non-contacting relation to the first contacts and attached to the first circuit board;

a pair of elastic members, one of the elastic members adapted to journal about a pivot point on the first circuit board and the other elastic member adapted to journal about another pivot point on the first circuit board, each elastic member having a first engagement means at one end thereof and a force receiving portion at the other end;

a second nonconductive body having a plurality of second contacts molded therein;

a second metal body adapted for connection to the first metal body and for supporting the second nonconductive body in an electrically non-contacting relation to the second contacts, the second metal body being attached to the second circuit board; and a pair of engagement members, one of the engagement members detachably mounted at one end of the second metal body and the other engagement member detachably mounted at the other end of the second metal body, at least one of the engagement members having a second engagement means, the engagement members held between the elastic members with the first engagement means engaged with the second engagement means so that journaling the elastic members bout said pivot points by forcing said force receiving portions of the elastic members toward each other causes the second metal body to move toward the first metal body.

2. The electrical connector according to claim 1, wherein at least one of the first and second metal bodies has a nonconductive member for positioning the contacts.

* * * * *